(12) United States Patent
Hidaka et al.

(10) Patent No.: US 6,885,685 B2
(45) Date of Patent: Apr. 26, 2005

(54) CONTROL SYSTEM FOR A LASER DIODE AND A METHOD FOR CONTROLLING THE SAME

(75) Inventors: Hirotoshi Hidaka, Yokohama (JP); Hiratake Iwadate, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 133 days.

(21) Appl. No.: 10/457,009

(22) Filed: Jun. 9, 2003

(65) Prior Publication Data

US 2004/0032889 A1 Feb. 19, 2004

(30) Foreign Application Priority Data

Jun. 11, 2002 (JP) ........................................ 2002-170473
Dec. 11, 2002 (JP) ........................................ 2002-359602

(51) Int. Cl.[7] .............................................. H01S 3/00
(52) U.S. Cl. ................ 372/38.2; 372/38.2; 372/29.015; 372/38.07; 372/26; 372/29.021
(58) Field of Search .................... 372/38.2, 26, 29.015, 372/38.07, 29.021

(56) References Cited

U.S. PATENT DOCUMENTS 5,019,769 A    5/1991  Levinson
6,160,647 A  * 12/2000  Gilliland et al. ............... 398/23
6,292,497 B1 *  9/2001  Nakano .................. 372/29.015
6,590,686 B1    7/2003  Sekiya et al.
6,711,189 B1 *  3/2004  Gilliland et al. .......... 372/38.02
6,795,458 B2 *  9/2004  Murata ........................ 372/26

* cited by examiner

*Primary Examiner*—Min Sun Harvey
*Assistant Examiner*—Delma R. Flores-Ruiz
(74) *Attorney, Agent, or Firm*—Smith, Gambrell & Russell, LLP

(57) ABSTRACT

According to the present invention, an optical transmitting system, which enables a precise control of the power and the extinction ratio of the optical output without a small amount of the preset data, will be provided. The system comprises a laser module and a control system that supplies a bias current and a modulation current to the laser module. In the present invention, one of the bias current and the modulation current of the semiconductor laser in the laser module is varied to maintain the power and the extinction ratio of the optical output, and the other of the bias current and the modulation current is calculated based on the specific function. Only coefficients of the specific function are stored in the control system. Therefore, the present invention does not need a large size of the storage in which both the bias current and the modulation current are stored as a table.

16 Claims, 7 Drawing Sheets

CONTROL SYSTEM FOR A LASER DIODE AND A METHOD FOR CONTROLLING THE SAME

BACKGROUND OF THE INVENTION

1. Field of the Invention

This invention relates to a method for controlling a semiconductor laser diode and an apparatus for controlling the laser diode.

2. Related Prior Art

Since an optical output and an extinction ratio of the laser diode depends on temperatures, a specific controller will be necessary to maintain the optical output and the extinction ratio thereof to a predetermined value. The laser diode emits light by supplying a bias current and a modulation current. The bias current and the modulation current determine the output power and the extinction ratio of the laser diode. Therefore, the both currents should be adjusted in various temperatures to keep the output power and the extinction ratio. Such control to keep the output power and the extinction ratio is called as an Auto-Power-Control (hereinafter denoted by APC) operation.

In general, the optical output power and the extinction ratio of the laser diode are defined by the specification, for example, the output power is −3 dBm and the extinction ratio is 7 dB, respectively. Therefore, it is required that the laser diode must be operated by controlling the bias current and the modulation current so as to keep the output power and the extinction ratio.

In a conventional APC operation, both currents are measured at various temperatures and the values thereof are stored in storage in advance of a practical use in the field. Once the bias current and the modulation current of the laser diode are fixed, the output power and the extinction ratio are automatically determined. Therefore, when the optical output power of the laser diode is discrepant to a target power, a new combination of the bias current and the modulation current are read out from the storage and provided to the laser diode so as to compensate the discrepancy of the power and the extinction ratio.

However, the conventional method requires a large storage because various combinations of the bias and the modulation current must be stored as a reference table. Moreover, to keep the output power and the extinction ratio of the laser diode in precise must prepare the reference table with a larger size, which results in the large and complicated optical module.

SUMMARY OF THE INVENTION

One feature of the present invention relates to a method of controlling the semiconductor laser that emits light with a predetermined output power and an extinction ratio. The laser is installed in a light transmitting module that has a data storage, a means for monitoring a portion of the light emitted from the laser diode and a processing unit. The control method comprises the steps of: (a) storing a plurality of parameters into the data storage in the transmitting module, (b) monitoring a photo current generated by the monitoring means, the photo current corresponding to the optical output power of the laser diode, (c) comparing the photo current with a target photo current in the processing unit, (d) changing one of a bias current and a modulation current by a prescribed amplitude, (e) calculating the other current based on the specific function characterized by the plurality of parameters stored in the data storage, (f) supplying thus defined bias current and the modulation current to the laser diode, and (g) iterating the steps from (b) to (e) until the optical output power and the extinction ratio of the laser diode become the predetermined value.

The data stored in the data storage is only the parameters that relate one of the bias current and the modulation current to the other current. Therefore, the size of the data storage can be reduced, and one of the currents is calculated based on the other current and the specific function characterized in the parameters. The accuracy of the control can be enhanced by precisely adjusting the other current. Even in such precise control, since the data should be stored in the storage are only parameters that characterizes the specific function, it is not necessary to increase the size of the storage.

In the present invention, the control of the bias current and the modulation current completes when a result of comparing the photo current with target photo current is smaller than the first threshold, and the control thereof starts when the results is greater than the second threshold. The first threshold may be greater than a half of a change of the photo current when one of the bias current and the modulation current is changed by the prescribed magnitude, and the second threshold may be smaller than a twice of the change of the photo current.

The change of the photo current may be calculated based on the change of the photo current of a reference diode, namely, the change of the photo current may be a product of the change of the photo current of the reference diode multiplied by a ratio of the target photo current of the laser diode to that of the reference laser diode. This relation that the first threshold depends on the change of the photo current can escape the control from an unstable operation caused by the rigidly set threshold to laser diodes each having inherent characteristics.

The prescribed magnitude for changing one of bias current and the modulation current may be varied depending on a result of comparing the photo current with the target photo current. When the difference of the photo current to the target photo current is large, the prescribed magnitude may be expanded. On the other hand, the prescribed magnitude may be reduced when the difference is small. This adjustable setting for the prescribed magnitude can accelerate the control.

Another feature of the present invention relates to a control system for a laser diode. The system comprises a laser module and a control apparatus. The laser module includes a semiconductor laser diode and a means for monitoring light emitted from the laser diode. The laser diode emits light by supplying a bias current and a modulation current. The control apparatus has storage and a processing unit. The data storage stores a plurality of parameters to define a specific function that relates one of the bias current and the modulation current to the other of the bias and the modulation current. The processing unit compares a photo current generated by the monitoring means with a target photo current, in which the laser diode emits light with a predetermined optical power and an extinction ratio. The unit changes one of the bias current and the modulation current by a predetermined magnitude and calculates the other of the bias current and the modulation current based on the specific function and the changed one of the bias current and the modulation current, and finally both of the adjusted bias current and the adjusted modulation current are supplied to the laser diode.

In the configuration of the present invention, since the data stored in the data storage is only the parameters that relate one of the bias current and the modulation current to the other current, the size of the data storage can be reduced. Moreover, since the other current is calculated from one of the current and the specific function, the accuracy of the control can be enhanced by precisely adjusting the other current. Even in such precise control, since the data should be stored in the storage are only parameters that characterizes the specific function, it is not necessary to increase the size of the storage.

DETAILED DESCRIPTION OF THE INVENTION

Figure 1:
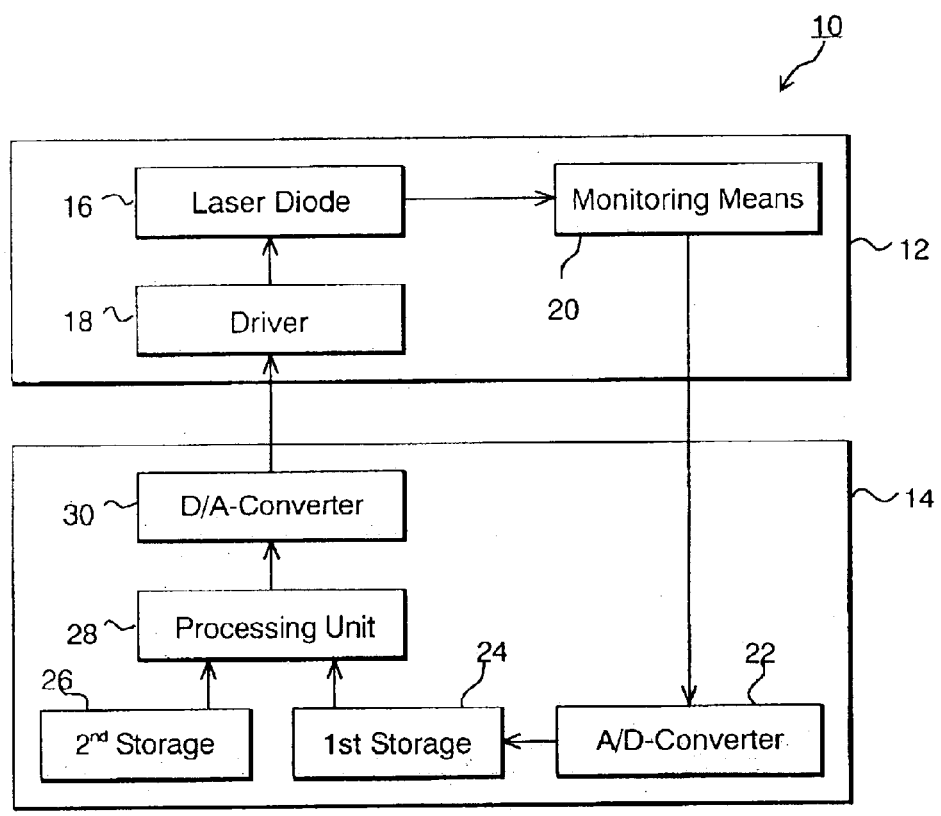
FIG. 1 is a block diagram of the control system of the laser diode according to the present invention.

The preferred embodiments of the present invention will be described in detail as referring to the drawings.

FIG. 1 is a schematic diagram of the control system 10 and an optical transmitting module 14. The system 10 comprises a laser module 12 and a controller 14. The laser module 12 includes a laser diode 16 (hereinafter denoted by LD), a driver 18 for driving the LD 16, and a means 20 for monitoring a light output from the LD 16.

The LD 16 emits light by supplying a bias current and a modulation current from the driver 18. The portion of the light emitted from the LD 16 is monitored by the monitoring means 20, which outputs a photo current $I_{PD}$ corresponding to the optical output of the LD 16. The monitoring means 20 is preferably a photo diode.

Figure 2:
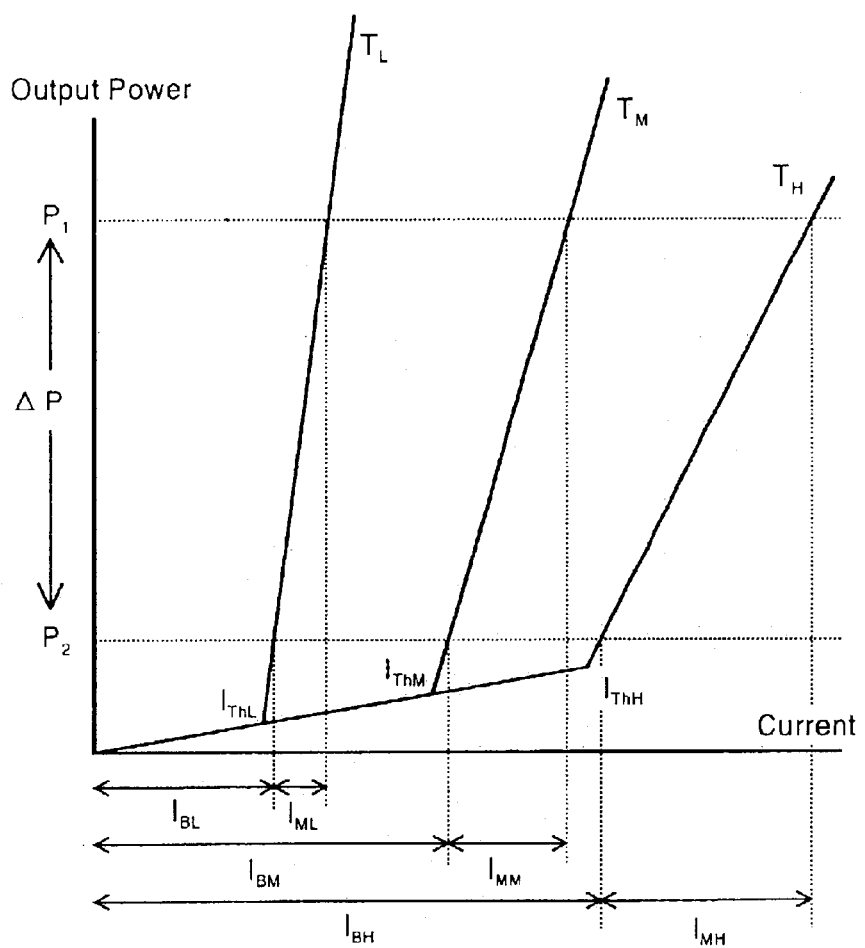
FIG. 2 shows relations between a supplied current and a light output of the laser diode in various temperatures.

FIG. 2 shows a relation between the supply current $I_{SP}$ to the LD 16 and the optical output power P of the LD 16, which is called I-L characteristic of the LD 16. The figure also shows a temperature dependence of the I-L characteristic. In FIG. 2, the LD 16 emits light when the supply current $I_{SP}$ exceeds a threshold current $I_{TH}$. At the optical output $P_2$, the bias current $I_B$ which involves some margin in addition to the threshold current $I_{TH}$ is supplied to the LD 16. While at the optical output $P_1$, a current that is a sum of the bias current and a modulation current is supplied. The extinction ratio is defined by $10* \log(\Delta P/P_2)$, where $\Delta P$ is a difference of the respective optical outputs $P_1-P_2$. The behavior of the I-L characteristic at various temperatures are also shown in FIG. 2, where $T_L$ corresponds to the I-L characteristic at relatively lower temperature while $T_H$ is that at relatively high temperature.

As shown in FIG. 2, both the bias current $I_B$ and the modulation current $I_M$ should be adjusted to maintain the optical output power and the extinction ratio to the predetermined values $P_1$ and $P_2$. This control of the LD 16, to keep both the optical output power and the extinction ratio to be constant even under the conditions that the temperature varies, is called APC operation.

Next, the operation of the controller 14 will be described.

The controller 14 performs the APC operation, and comprises an analog-to-digital converter (A/D-C) 22, a first storage 24, a second storage 26, a processing unit 28, and a digital-to-analog converter (D/A-C) 30. The A/D-C 22 outputs a signal in a digital form that corresponds to the photo current $I_{PD}$ output from the monitoring means 20. The first storage 24 temporarily stores the digital signal of the photo current $I_{PD}$.

Figure 3:
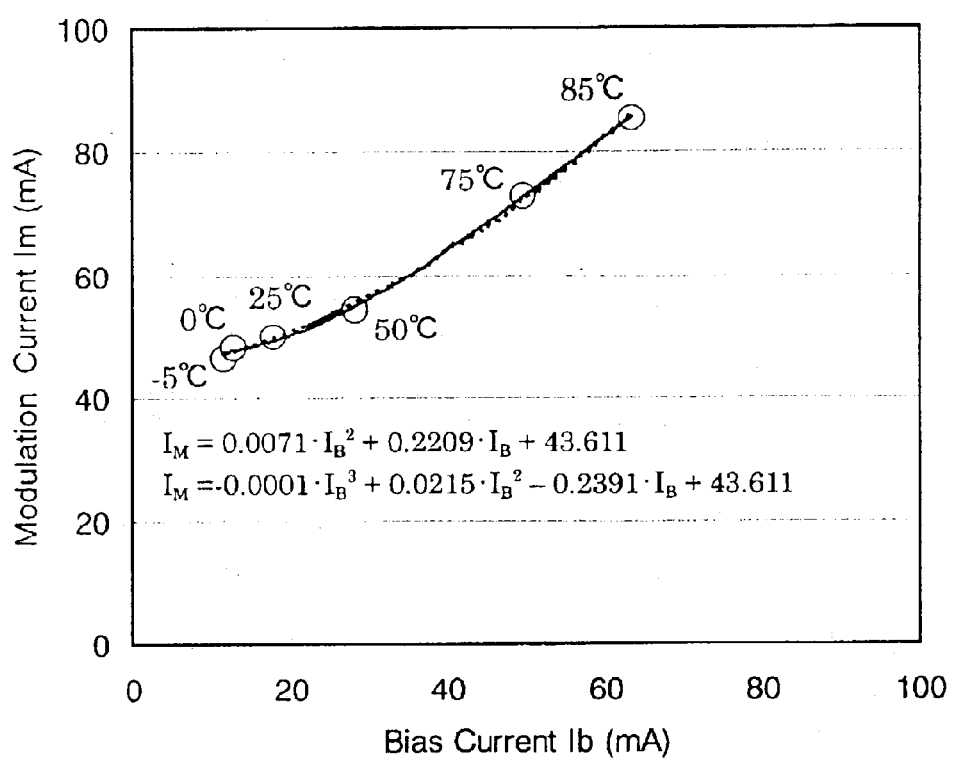
FIG. 3 is an example of specific functions that relates the bias current to the modulation current.

The second storage 26 stores parameters by which a specific function relating the bias current $I_B$ to the modulation current $I_M$ is defined. The relation means that the output power $P_1$ and the extinction ratio are kept constant under the combination of the bias current and the modulation current in various temperatures, which is denoted by $I_M=f(I_B)$. Exemplary, the specific function is an n-th order homogeneous function, the parameters of which is denoted by $X_0$, $X_1, \ldots X_n$. FIG. 3 shows an example of the relation of the modulation current to the bias current under various temperatures from $-5°$ C. to $85°$ C. FIG. 3 also shows two example of the specific function in the second order and the third order, respectively. In the second order homogeneous function, the parameters of $X_0=43.61$, $X_1=0.2209$, and $X_2=0.0071$ are stored in the storage, while the case of the third order function, $X_0=47.56$, $X_1=-0.2391$, $X_2=0.0215$, and $X_3=-0.0001$ are stored. The second storage 26 is preferably a read-only-memory (ROM).

The processing unit 28 calculates the bias current $I_B$ and the modulation current $I_M$ to be supplied to the LD 16 based on the monitored photo current $I_{PD}$, which corresponds to the optical output power of the LD 16, and the specific function defined by the parameters $X_i$ stored in the second storage. When an absolute difference $D_{IPD}$ of the photo current $I_{PD}$ to a target photo current $I_{PD(0)}$ is greater than a predetermined upper threshold $Th_U$, the processing unit 28 starts the calculation for obtaining the modulation current $I_M$. While, the absolute difference $D_{IPD}$ becomes smaller than a lower threshold $Th_L$, the processing unit 28 completes the calculation for the modulation current $I_M$. The D/A-C 30 converts the results of the bias current $I_B$ and the modulation current $I_M$ calculated by the processing unit 28 to analog forms. Both currents $I_B$ and $I_M$ are finally supplied to the LD 16 through the driver 18.

Thus, the data stored in the second storage is only the parameters that relates the bias current to the modulation current, the size of the second storage can be reduced. Further, the modulation current is calculated based on the bias current and the specific function characterized in the parameters, the accuracy of the controlling of the laser diode 16 can be enhanced by precisely adjusting the bias current. Even in such precise control, since the data should be stored in the second storage are only parameters that characterizes the specific function, it is not necessary to increase the size of the second storage.

Figure 4:
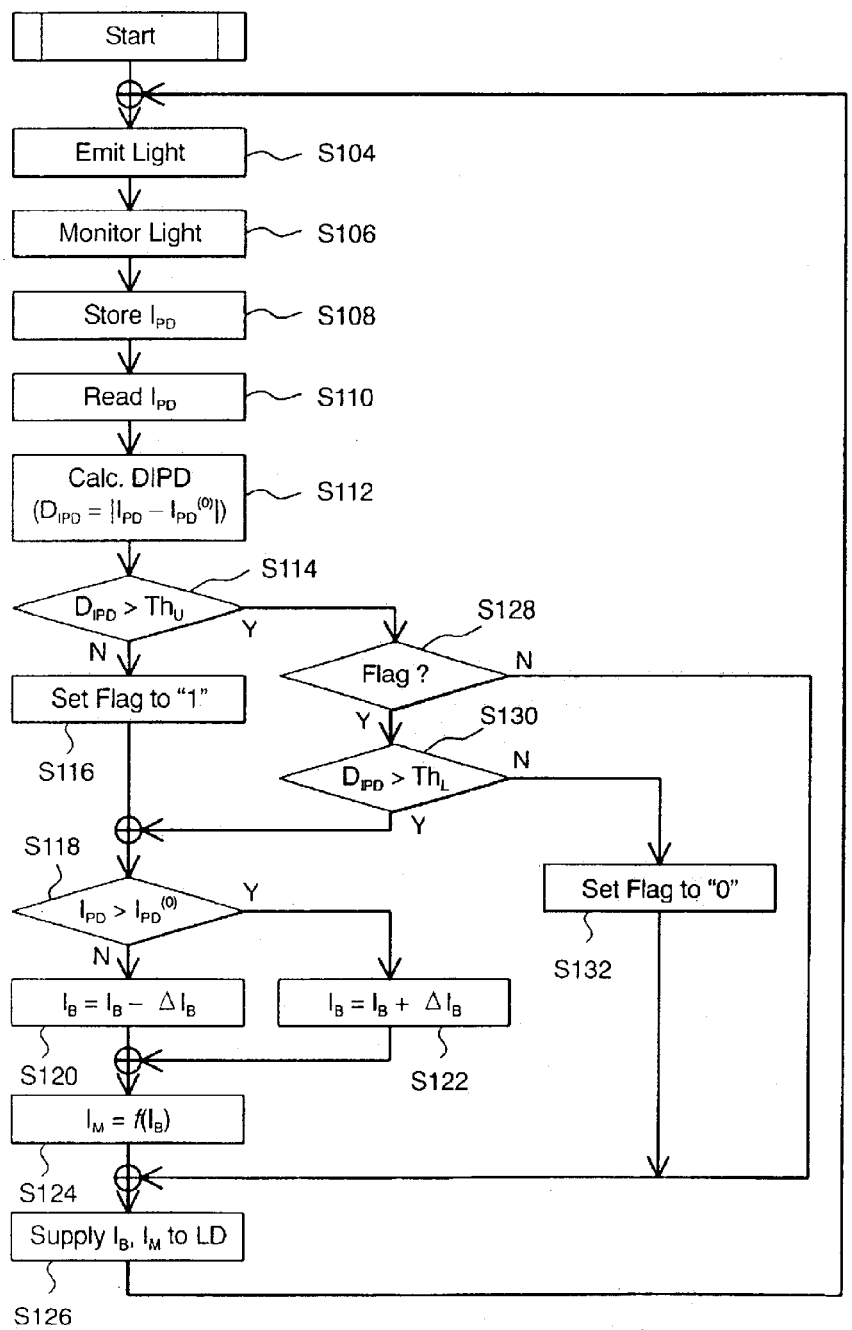
FIG. 4 is a flow chart showing a control algorithm of the laser diode.

Next, a method for controlling the optical output of the LD 16 accompanied with the method to decide the upper threshold $Th_U$ and the lower threshold $Th_L$ will be described as showing an algorithm thereof in FIG. 4. In the explanation, an APC flag that denotes whether the APC is under the operation or not is set to be "0" at the beginning.

First, some bias current $I_B$ and some modulation current $I_M$ are provided to the LD 16 through the driver 18 at sequence S104. The monitoring means 20 monitors the optical output power of the LD 16 and outputs a photo current $I_{PD}$ at sequence S106. The photo current $I_{PD}$ output from the monitoring means is converted to the digital form by the A/D-C 22 and stored in the first storage 24 at sequence S108.

Next, the processing unit 28 reads out the magnitude of the photo current $I_{PD}$ stored in the first storage 24 at sequence S110 and calculates adjusted bias current $I_B'$ and the modulation current $I_M'$ based on the photo current $I_{PD}$ and the specific function $f$ characterized by parameters $X_i$. The following will be described the algorithm of the calculation at the processing unit 28.

An absolute difference $D_{IPD}$ of the monitored photo current $I_{PD}$ to the target photo current $I_{PD(0)}$ is calculated at sequence S112. The absolute difference $D_{IPD}$ is compared to the predetermined upper threshold $Th_U$ that decides whether the APC operation starts or not at sequence S114. When the absolute difference $D_{IPD}$ is greater than the upper threshold $Th_U$, the processing unit 28 set the APC flag to "1" at sequence S116, and further compares the photo current $I_{PD}$ to the target photo current $I_{PD(0)}$ at sequence S118. When the photo current $I_{PD}$ is greater than the target photo current $I_{PD(0)}$, which corresponds to the case "Y" at sequence S118, the bias current $I_B$ is reduced by a prescribed magnitude $\Delta I_B$ at sequence S120. On the other hand, the photo current $I_{PD}$ is smaller than the target photo current $I_{PD(0)}$, the bias current to be supplied to the LD 16 is increased by the prescribed magnitude $\Delta I_B$ at sequence S122. The adjusted modulation current $I_M$ to be provided to the LD 16 is calculated at sequence 124 based on the specific function $f$ characterized by the parameters Xi and the bias current $I_B$ thus defined at sequence S120 or S122. The adjusted bias current $I_B$ and the calculated modulation current $I_M$ are converted to analog forms at D/A-C 30 and supplied to the LD 16 through the driver 18 at sequence 126.

Next, another case will be described. When the absolute difference $D_{IPD}$ of the photo current $I_{PD}$ to the target photo current $I_{PD(0)}$ is smaller than the upper threshold $Th_U$, which corresponds to the case "N" in sequence S114.

First, whether the APC flag is set or not is judged at sequence S128. When the APC flag is set to "1", which corresponds "Y" at sequence S128, a further judgement whether the absolute difference $D_{IPD}$ is greater that the lower threshold $Th_L$ or not is performed at sequence S130. The lower threshold $Th_L$ is the threshold for completing the APC operation. When the absolute difference $D_{IPD}$ is greater than the lower threshold $Th_L$, which is "Y" in sequence S130, the operation moves to sequence S118. On the other hand, the absolute difference $D_{IPD}$ is smaller than the lower threshold $Th_L$, which is "N" in sequence S130, then the APC flag is set to "0" at sequence S132 and the operation goes to sequence S126. In the latter case, the unchanged bias current $I_B$ and the modulation current $I_M$ are supplied to the LD 16.

Thus described above, the APC operation for adjusting the bias current $I_B$ and the modulation current $I_M$ of the LD 16 starts when the absolute difference $D_{IPD}$ exceeds the upper threshold $Th_U$. The sequence above described will be iterated until the absolute difference $D_{IPD}$ becomes smaller than the lower threshold $Th_L$ and the bias current $I_B$ and the modulation current $I_M$ supplied to the LD 16 are stabilized, in which the LD 16 emits light with the predetermined output power and the predetermined extinction ratio. The APC operation will complete when the difference $D_{IPD}$ is smaller than the lower threshold $Th_L$.

Next, the second embodiment of the present invention will be described. In the case that two thresholds are rigidly fixed for various laser diodes, characteristics of which are varied in respective lasers, it is considered that the absolute difference of the photo current $I_{PD}$ to the target photo current $I_{PD(0)}$ magnified due to the increase/decrease of the bias current by the predetermined magnitude, which causes an instability of the operation of the laser diode. This instability occurs when the change of the photo current due to the APC operation exceeds twice of the lower threshold $Th_L$.

Therefore, in the second embodiment, the processing unit 28 performs a function to decide the upper threshold $Th_U$ and the lower threshold $Th_L$ based on the following relations:

$$\Delta I_{PD}/2 < Th_L < Th_U < 2 \cdot \Delta I_{PD}. \tag{1}$$

Where, $\Delta I_{PD}$ corresponds to a change of the photo current $I_{PD}$ when the bias current $I_B$ is varied by a prescribed magnitude $\Delta I_B$.

The processing unit 28 preferably has a function to reduce the change of the photo current $\Delta I_{PD}$ by the following relation to decide the upper threshold $Th_U$ and the lower threshold $Th_L$:

$$\Delta I_{PD} = \Delta I_{PD}^{(S)} \cdot I_{PD(0)} / I_{PD(0)}^{(S)}. \tag{2}$$

Where $\Delta I_{PD}^{(S)}$ is a change of the photo current $I_{PD}$ of a reference laser diode different to the LD 16, which is measured by changing the bias current $I_B$ of the reference diode by the prescribed magnitude $\Delta I_B$, and $I_{PD(0)}^{(S)}$ is a target photo current of the reference diode, both values are measured in advance to the APC operation of the present LD 16. The reason why the change of the photo current $\Delta I_{PD}$ can be calculated as described above is that the change thereof proportions to the target photo current $I_{PD(0)}$.

Figure 5:
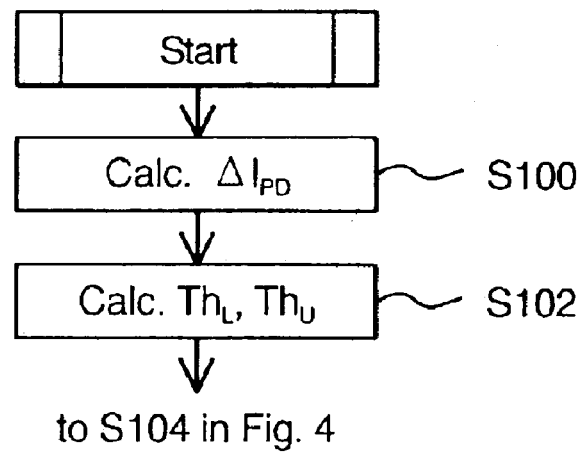
FIG. 5 shows a algorithm performed prior to the control.

FIG. 5 shows an algorithm according to the second embodiment. First, the processing unit 28 calculates the change of the photo current $\Delta I_{PD}$ from the change of the photo current $\Delta I_{PD}^{(S)}$, the target photo current $I_{PD(0)}^{(S)}$, each depends on the reference diode, and the target photo current $I_{PD(0)}$ of the LD 16 in accordance with Eq. 2 at sequence S100. Next at sequence S102, the unit 28 decides the upper threshold $Th_U$ and the lower threshold $Th_L$ based on the change of the photo current $\Delta I_{PD}$ calculated at sequence S100 so as to satisfy Eq. 1. After two thresholds are decided, the LD 16 are provided with the bias current $I_B$ and the modulation current $I_M$. Subsequently sequences are same as those of the first embodiment.

Figure 6:
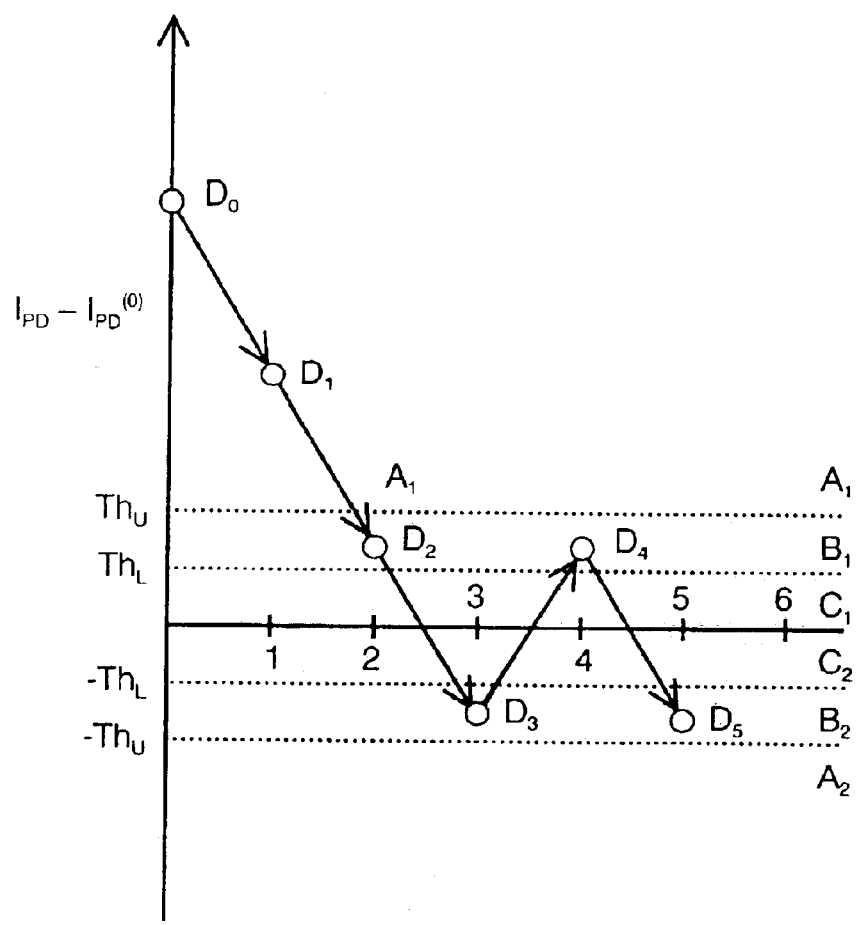
FIG. 6 shows an example of an unstable operation.

FIG. 6 schematically shows a case that the APC operation falls into unstable, in which the change of the photo current $\Delta I_{PD}$ is fluctuated, namely the lower threshold $Th_L$ is smaller than a half of the change $\Delta I_{PD}$. In FIG. 6, the vertical axis denotes the difference $D_{IPD}$ between the photo current $I_{PD}$ and the target photo current $I_{PD(0)}$, while the horizontal axis corresponds to the iteration of the APC operation. The absolute difference $D_{IPD}$ is greater than the upper threshold $Th_U$ in regions $A_1$ and $A_2$. In regions $B_1$ and $B_2$, the difference $D_{IPD}$ is between the lower threshold $Th_L$ and the upper threshold $Th_U$. The difference $D_{IPD}$ is smaller than the lower threshold in regions $C_1$ and $C_2$.

As shown in FIG. 6, the absolute difference $D_{IPD}$ moves from $D_0$ in the region $A_1$ to $D_1$ in the region $A_1$ after one cycle of the APC operation. The difference between $D_0$ and $D_1$ corresponds to the change of the photo current $\Delta I_{PD}$ in Eqs. 1 and 2. After another iteration of the APC operation, the difference of the photo current moves to $D_2$ in the region $B_1$. Since the APC operation does not complete in the region $B_1$, another iteration of the APC operation will be started. However, the difference of the photo current moves from $D_2$ in $B_1$ to $D_3$ in $B_2$ because the change of the photo current $\Delta I_{PD}$ is twice greater than the lower threshold $Th_L$. Subsequently to the second iteration of the APC operation, the change of the photo current moves between the region $B_1$ and the region $B_2$ even if the bias current $I_B$ and modulation current $I_M$ are adjusted. Thus, the case that the APC operation eternally continues will be considered.

Figure 7:
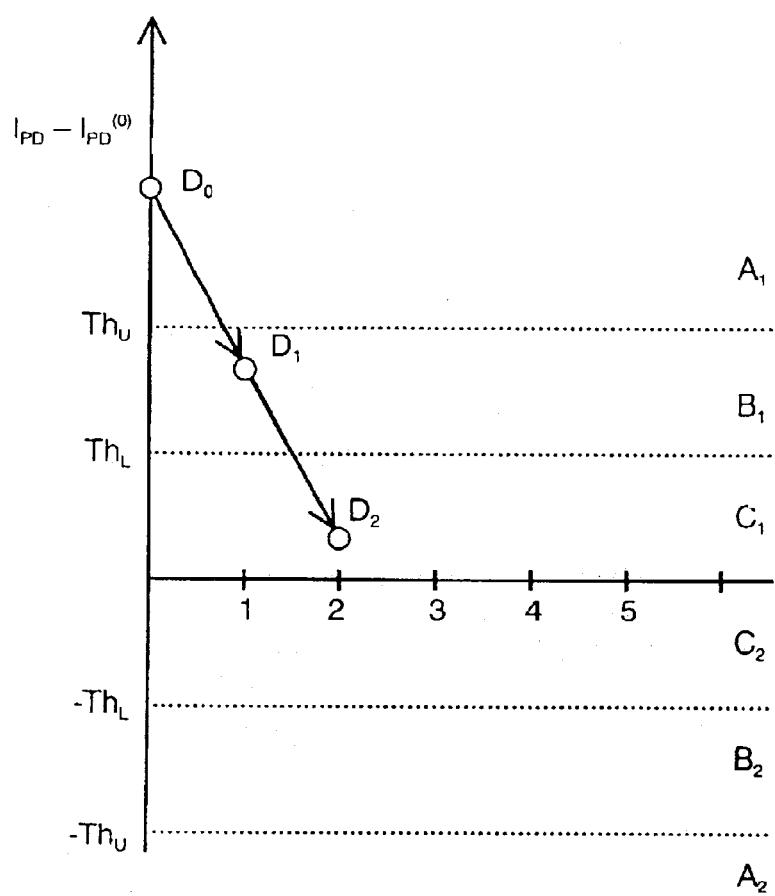
FIG. 7 shows an example of a stable operation.

FIG. 7 shows an example of the modified APC process according to the second embodiment. In the embodiment of FIG. 7, the change of the photo current $\Delta I_{PD}$ is calculated from the target photo current $I_{PD(0)}$ of the LD 16, the change of the photo current $\Delta I_{PD}^{(S)}$ and the target photo current $I_{PD(0)}^{(S)}$ of the reference diode as shown in Eq. 2. The lower threshold $Th_L$ is equal to the change of the photo current $\Delta I_{PD}$, and at the same time, the upper threshold $Th_U$ is selected so as to satisfy Eq. 1.

As shown in FIG. 7, after one iteration of the APC operation, the difference of the photo current $I_{PD}$ to the target photo current $I_{PD(0)}$ moves from $D_0$ in the region $A_1$ to $D_1$ in the region $B_1$. Further iteration of the APC operation for the bias current $I_B$ and the modulation current $I_M$ moves the difference $D_1$ in the region $B_1$ to $D_2$ in the region $C_1$ because the lower threshold $Th_L$ is greater than a half of the change of the photo current $\Delta I_{PD}$. After moving to $D_2$ in the region $C_1$, the APC operation is completed, thereby the operation does not fall into instability.

When the difference of the photo current $I_{PD}$ to the target photo current $I_{PD(0)}$ is in the region $A_1$, the bias current $I_B$ and the modulation current $I_M$ are modified by the APC operation. The upper threshold $Th_U$ satisfies Eq. 1 and also the lower threshold $Th_L$ is equal to the change of the photo current $\Delta I_{PD}$, transitions of the difference of the photo current from the region $A_1$ to the regions $A_2$, $B_2$, or $C_2$ do not occur. The difference of the photo current moves from the region $A_1$, to one of regions $A_1$, $B_1$, and $C_1$. When the transition from the region $A_1$ to the region $A_1$, the iteration of the APC operation performs the difference of the photo current from the region $A_1$ to the region $B_1$, and finally subsequent iterations can falls the difference from the region $B_1$ into the region $C_1$. When the transition from the region $A_1$ to the region $B_1$, another adjustment of the bias current $I_B$ and the modulation current $I_M$ are performed because the APC operation does not complete in the region $B_1$. Since the lower threshold $Th_L$ is equal to the change of the photo current $\Delta I_{PD}$, the transition from the region $B_1$ to the region $C_1$ inevitably occur, thus completing the APC operation. The APC operation also completes when the directly transition from the region $A_1$ to the region $C_1$ is occurred.

Although the operations above described are the case when the difference of the photo current $I_{PD}$ to the target photo current $I_{PD(0)}$ is in the region $A_1$, an similar process can be operated when the difference of the photo current is in the region $B_1$. Namely, further adjustment of the bias and the modulation current according to the algorithm described in FIG. 4 moves the difference of the photo current in the region $B_1$ into the region $C_1$. Similarly, when the difference of the photo current is in the regions $A_2$ or $B_2$ at the starting, the iteration of the APC operation moves the difference to the region $C_2$, thereby completing the APC operation without any fluctuation.

Thus in the present embodiment, since the lower threshold $Th_L$ is equal to the change of the photo current $\Delta I_{PD}$ and the magnitude of the upper threshold $Th_U$ is smaller than twice of the change of the photo current $\Delta I_{PD}$ in the present embodiment, relatively fewer iteration of the APC sequence enables the difference of the photo current $D_{IPD}$ smaller than the lower threshold $Th_L$, consequently results on the rapid stability of the optical output of the LD 16.

The processing unit 28 calculates the change of the photo current $\Delta I_{PD}$ based on both the target current $I_{PD(0)}$ of the LD 16, that of the reference diode $I_{PD(0)}^S$ and the change of the photo current of the reference diode $\Delta I_{PD}^{(S)}$, it is not necessary to measure the change of the photo current $\Delta I_{PD}$ for every laser diode.

From the invention thus described, the invention and its application may be varied in many ways. Although the magnitude of the change of the bias current preset for the calculation of the modulation current is fixed in both embodiment, it can depend on the absolute difference of the photo current $I_{PD}$ to the target photo current $I_{PD(0)}$. Namely, a relatively large magnitude is set when the absolute difference is large, while a relative small value is set when the difference is small. By varying the magnitude, the convergence of the APC operation can be accelerated.

The second storage 26 stores parameters Xi to define the specific function $f$ that relates the modulation current $I_M$ to the bias current $I_B$ to maintain the optical output power and the extinction ratio of the LD 16. The processing unit 28 reads out the parameters Xi from the second storage and decides the modulation current $I_M$ and the bias current $I_B$ to be supplied to the LD 16 based on the specific function. Therefore, the size of the second storage is required for storing only the parameters Xi.

When the pair of the bias current $I_B$ and the modulation current $I_M$ is stored as a table, the number of the data pair must be increased when the accuracy of the control to maintain the output power and the extinction ratio of the LD 16 is enhanced. In the present invention, because the modulation current $I_M$ is calculated in the processing unit, the accuracy of the controlling can be enhanced only by shrinking the magnitude of the increase/decrease of the bias current $\Delta I_B$, namely, the accuracy of the controlling can be increased without expanding the size of the data to be stored.

Although the modulation current $I_M$ is calculated from the bias current $I_B$ in both embodiments, the bias current $I_B$ may be calculated from the modulation current $I_M$, namely the function of $I_B = f(I_M)$ is also applicable. In this case, the bias current $I_B$ will be calculated from the increase/decrease of the modulation current $\Delta I_M$ and the characteristic function $f(I_m)$.

Moreover, although the lower threshold $Th_L$ is equal to the change of the photo current $\Delta I_{PD}$ in the second embodiment, it is not restricted to the such relation and the lower threshold $Th_L$ is only required to satisfy Eq. 1. When the lower threshold $Th_L$ is not equal to the change of the photo current $\Delta I_{PD}$, the transitions from the region $A_1$ to the region $C_2$ and from the region $B_1$ to the region $C_2$ will be considered in FIG. 6. However, in such transition may occur, the APC operation will complete when the difference of the present photo current and the target photo current falls into the region $C_2$. Therefore, even the lower threshold $TH_L$ does not coincide with the change of the photo current $\Delta I_{PD}$, the APC operation will reliably compete when the relation of Eq. 1 is satisfied.

Although the upper threshold $Th_U$ is set to be twice of the change of the photo current $\Delta I_{PD}$, it is not restricted to such relation. For example, the upper threshold $Th_U$ may be the difference between the maximum applicable in the target photo current and the target photo current. Moreover, it may be applicable that the upper threshold $Th_U$ and the lower threshold $Th_L$ are coincided with each other.

What is claimed is:

1. A method of controlling a semiconductor laser diode for emitting light with a predetermined optical output power and an extinction ratio by supplying a bias current and a modulation current thereto, the laser diode being installed in a laser module having a data storage and a means for monitoring a portion of the light emitted from the laser diode, the method comprising the steps of:

(a) storing a plurality of parameters into the data storage, the parameters defining a specific function that relates one of the bias current and the modulation current to the other current, thereby the laser diode emitting light with the predetermined optical output power and the extinction ratio;

(b) monitoring a photo current generated by the monitoring means, the photo current corresponding to the optical output power of the laser diode;

(c) comparing the photo current with a target photo current;

(d) changing one of the bias current and the modulation current by a prescribed magnitude;

(e) calculating the other current based on the specific function characterized by the plurality of parameters;

(f) supplying the bias current and the modulation current to the laser diode; and (g) iterating the steps from (b) to (f) until the optical output power and the extinction ratio of the laser diode become predetermined values.

2. The method of controlling the laser diode according to claim 1, wherein the step (d) completes when the absolute difference of the photo current to the target photo current is smaller than a first threshold, and the step (d) starts when an absolute difference is greater than a second threshold, the first threshold being smaller than the second threshold.

3. The method of controlling the laser diode according to claim 2, wherein the first threshold is greater than a half of a predetermined level of the photo current and the second threshold is smaller than the predetermined level, wherein the predetermined level is a change of the photo current when one of the bias current and the modulation current is changed by the prescribed magnitude.

4. The method of controlling the laser diode according to claim 2, wherein the first threshold is greater than a half of a predetermined level of the photo current and the second threshold is smaller than the predetermined level, wherein the predetermined level is a change of the photo current of a reference diode when one of the bias current and the modulation current supplied to the reference diode is changed by the prescribed magnitude, multiplied by a ratio of the target photo current to a target photo current of the reference diode.

5. The method of controlling the laser diode according to claim 1, wherein the specific function is n-th order homogeneous function.

6. The method of controlling the laser diode according to claim 5, wherein the specific function is the second order homogeneous function.

7. The method of controlling the laser diode according to claim 5, wherein the specific function is the third order homogeneous function.

8. The method of controlling the laser diode according to claim 1, wherein the prescribed magnitude is varied based on a result of comparing the photo current with the target photo current.

9. A control system for a laser diode, comprising:

a laser module including:

a semiconductor laser diode for emitting light with a predetermined optical output power and an extinction ratio by supplying a bias current and a modulation current thereto, and a means for monitoring a portion of the light emitted from the laser diode and generating a photo current corresponding to the monitored light; and a control apparatus including:

a data storage for storing a plurality of parameters to define a specific function relating one of the bias current and the modulation current to the other current, and a processing unit for performing sequences of comparing the photo current generated by the monitoring means with a target photo current, changing one of the bias current and the modulation current by a prescribed magnitude, and calculating the other current based on the specific function characterized by the plurality of parameters stored in the data storage.

10. A control system according to claim 9, wherein the processing unit completes the change of one of the bias current and the modulation current when an absolute difference of the photo current to the target photo current is smaller than a first threshold, and starts the change of one of the bias current and the modulation current when the absolute difference of the photo current to the target photo current is greater than a second threshold.

11. A control system according to claim 10, wherein the first threshold is greater than a half of a predetermined level of the photo current and the second threshold is smaller than the predetermined level, the predetermined level being a change of the photo current when one of the bias current and the modulation current is changed by the prescribed magnitude.

12. A control system according to claim 10, wherein the first threshold is greater than a half of a predetermined level of the photo current and the second threshold is smaller than the predetermined level, wherein the predetermined level is a change of the photo current of a reference diode when one of the bias current and the modulation current supplied to the reference diode is changed by the prescribed magnitude, multiplied by a ratio of the target photo current to a target photo current of the reference diode.

13. A control system according to claim 9, wherein the specific function is n-th order homogeneous function.

14. A control system according to claim 9, wherein the specific function is the second order homogeneous function.

15. A control system according to claim 9, wherein the specific function is the third order homogeneous function.

16. A control system according to claim 9, wherein the prescribed magnitude for changing of one of the bias current and the modulation current is varied based on a result of comparing the photo current with the target photo current.

* * * * *